United States Patent
Gottscho et al.

[11] Patent Number: 5,976,637
[45] Date of Patent: Nov. 2, 1999

[54] METHOD FOR COATING HETEROGENEOUS SUBSTRATES WITH HOMOGENEOUS LAYERS

[75] Inventors: Richard Alan Gottscho, Maplewood, N.J.; Jeffrey Alan Gregus, Bethlehem, Pa.; Po-Yen Lu, Mendham, N.J.

[73] Assignee: Lucent Technologies Inc., Murray Hill, N.J.

[21] Appl. No.: 08/746,184

[22] Filed: Nov. 6, 1996

Related U.S. Application Data

[63] Continuation of application No. 08/537,198, Sep. 29, 1995, abandoned.

[51] Int. Cl.$^6$ ........................................... H05H 1/20
[52] U.S. Cl. ................. 427/573; 204/192.1; 427/250; 427/255.27; 427/264; 427/270; 427/271; 427/294; 427/404; 427/419.7; 427/574; 427/576; 427/579; 427/585
[58] Field of Search ........................ 427/573, 574, 427/576, 579, 585, 250, 255.27, 264, 270, 271, 404, 419.7, 294; 204/192.1

[56] References Cited

U.S. PATENT DOCUMENTS 5,346,601  9/1994  Barada et al. .

FOREIGN PATENT DOCUMENTS 0 712 156 A2  5/1996  European Pat. Off. .

OTHER PUBLICATIONS

F.B. Kaufman et al., "Chemical–Mechanical Polishing for Fabricating Patterned W Metal Features as Chip Interconnects", *Journal of the Electrochemical Society*, vol. 138, No. 11, Nov. 1991.

*Primary Examiner*—Bernard Pianalto

[57] ABSTRACT

The present invention is predicated on applicants' discovery that inhomogeneity in films deposited on heated heterogeneous substrates can be substantially reduced by patterning the large area metal structures. Specifically, metal structures having areas in excess of about 2 mm$^2$ are patterned so that the metal is within 1 mm of a metal edge. Thus, for example, a normally solid chromium bonding pad on a glass substrate is conveniently made as a patterned, open grid of 1 mm chromium lines. With such patterning, a subsequently deposited layer of silicon nitride has enhanced homogeneity over a large area, including enhanced uniformity of etching rate.

10 Claims, 3 Drawing Sheets

5,976,637

METHOD FOR COATING HETEROGENEOUS SUBSTRATES WITH HOMOGENEOUS LAYERS

This application is a continuation of application Ser. No. 08/537,198, filed Sep. 29, 1995, now abandoned.

FIELD OF THE INVENTION

This invention relates to methods for applying layers of material and, in particular, to a method for applying a homogeneous layer of material onto a heterogeneous substrate surface.

BACKGROUND OF THE INVENTION

The application of thin films of material is useful in a variety of commercial processes. The application of thin layers of silicon nitride, for example, is used in the manufacture of integrated circuits to provide a thin, conformable layer of high quality dielectric. In these applications the nitride is typically applied onto heterogeneous substrates such as patterned metal on silicon. The largest metal components in these applications typically have areas no larger than a few tens of square microns.

More recently in the fabrication of flat panel displays, silicon nitride layers have been applied to larger area heterogeneous substrates such as patterned chromium on glass. In this application patterned metal components having areas of square millimeters or more are desired, but the silicon nitride films deposited on these heterogeneous surfaces are non-homogeneous in significant respects. For example the etch rate of the deposited silicon nitride varies widely from location to location, making the design and fabrication of displays difficult and expensive. Similar inhomogeneities are observed in the application of other thin films such as silicon oxide ($SiO_x$) and amorphous silicon (a—Si) when they are deposited on heated heterogeneous substrates in a reduced pressure ambient.

Accordingly, there is a need for an improved method of applying homogeneous layers onto heterogeneous substrates.

SUMMARY OF THE INVENTION

The present invention is predicated on applicants' discovery that inhomogeneity in films deposited on heated heterogeneous substrates can be substantially reduced by patterning the large area metal structures. Specifically, metal structures having areas in excess of about 2 $mm^2$ are patterned so that the metal is within 1 mm of a metal edge. Thus, for example, a normally solid chromium bonding pad on a glass substrate is conveniently made as a patterned, open grid of 1 mm chromium lines. With such patterning, a subsequently deposited layer of silicon nitride has enhanced homogeneity over a large area, including enhanced uniformity of etching rate.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphs, are not to scale.

DETAILED DESCRIPTION

Figure 1:
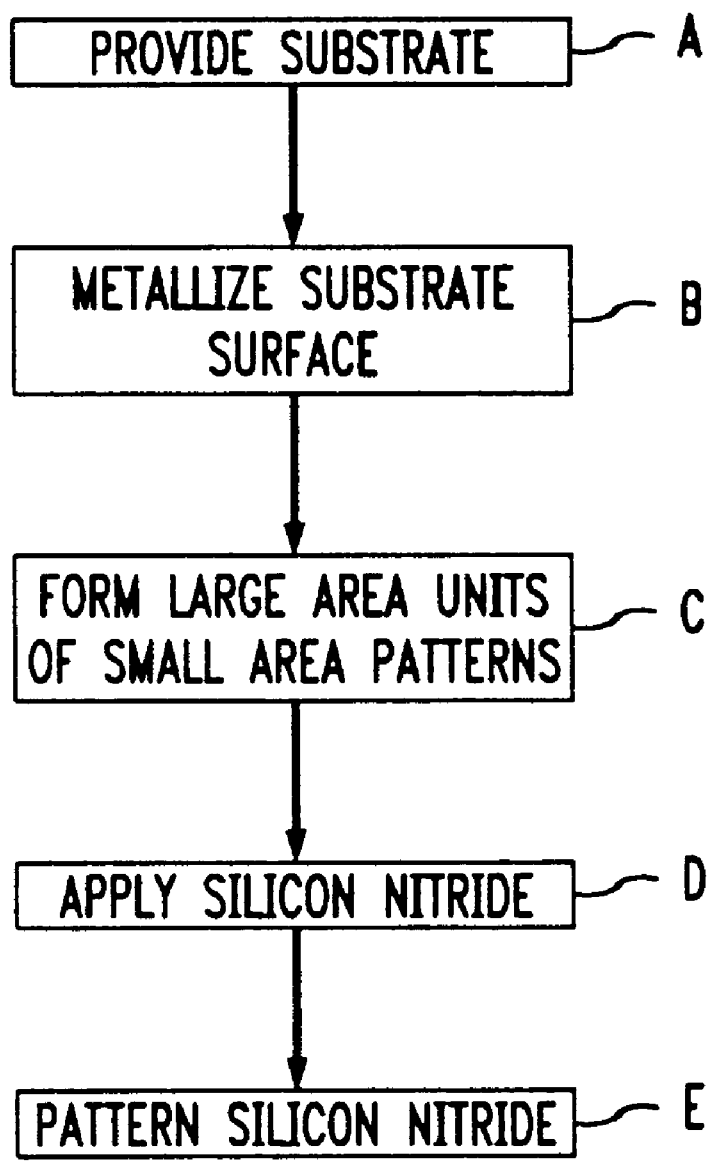
FIG. 1 is a flow diagram of a process for applying a silicon nitride layer of enhanced homogeneity.

Referring to the drawings, FIG. 1 is a flow diagram showing the steps in a preferred process for applying a layer of enhanced homogeneity. As shown in block A of FIG. 1, the first step is to provide a substrate. While a wide variety of insulating and semiconductor substrates are suitable, in the exemplary application of making flat panel displays, the preferred substrate is glass such as Corning 7059.

The next step shown in block B is to apply a layer of metal to the working surface of the substrate. There are a wide variety of techniques available for applying metal including vacuum evaporation and sputtering. For the fabrication of displays, the preferred metal is chromium, and the preferred application process is sputtering.

Block C shows the third step which is to pattern the metal to form one or more large area units comprised of small area patterns. Specifically, included among the metal pattern should be one or more units having an overall area on the surface in excess of about 2 $mm^2$. These large area units should be patterned so that the bulk (>90%) of the metal is within 1 mm of an edge of the metal pattern.

Figure 2:
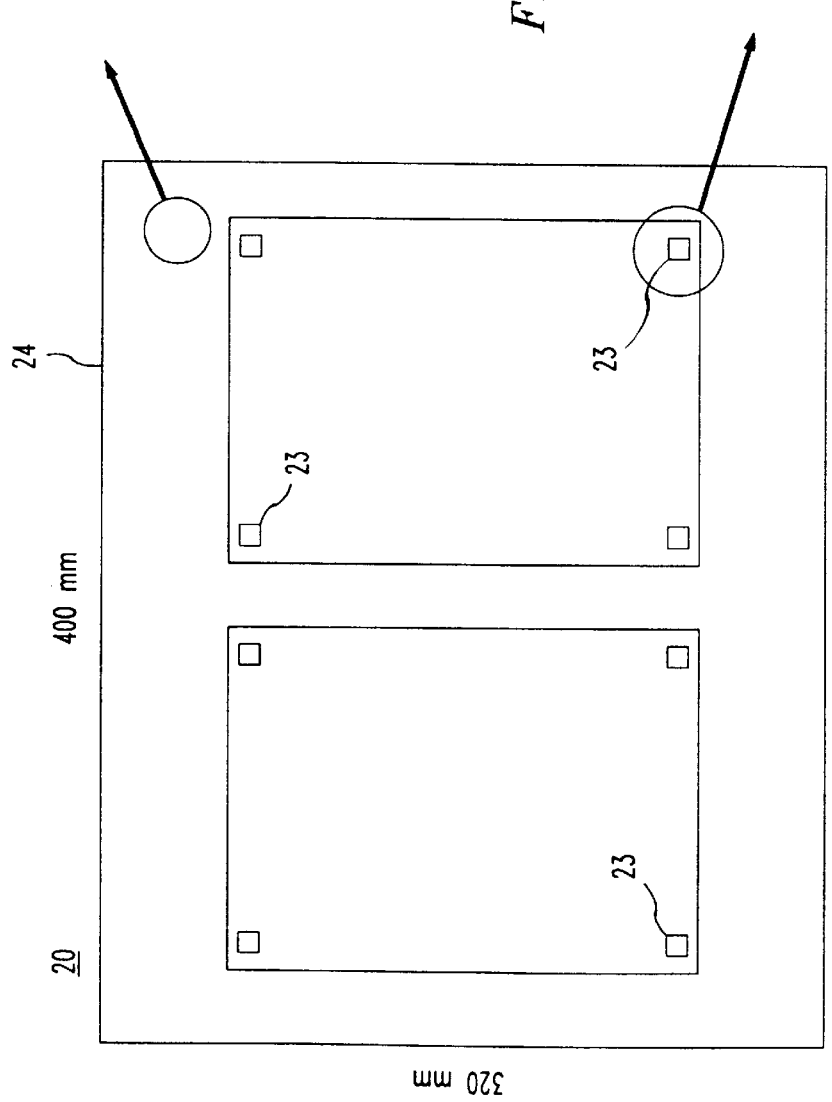
FIG. 2 schematically illustrates a panel workpiece for a flat panel display made using the process of FIG. 1.

This step can be better understood by reference to FIG. 2, which shows a substrate 20 having a planar major surface including a plurality of large area metal units (area <2 $mm^2$) such as bonding pad contacts 23 and a frame 24. These large area units each include internal patterning so that the bulk of the metal is within 1 mm of an edge of the pattern.

Figure 4:
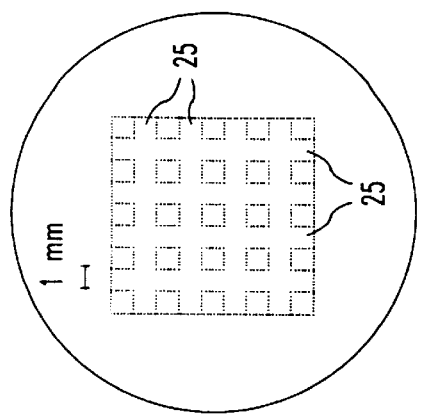
FIGS. 3 and 4 are enlarged views of portions of the panel workpiece of FIG. 2.
Figure 3:
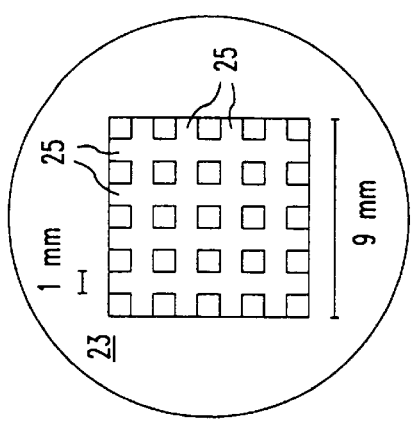

As shown in the enlarged views of FIGS. 3 and 4, the large area metal units 23, 24 are configured into a grid of interconnected, intersecting strips 25 approximately 1 mm wide so that the bulk of the metal is within 1 mm of a metal edge. The large are metal units have dimensions of at least 9 mm×9 mm corresponding to areas of at least 81 $mm^2$. This patterning can be achieved by any one of a variety of patterning processes such as conventional photolithography or silk screening.

The next step shown in block D is to apply a layer of dielectric material such as silicon nitride on the working surface over the patterned large area metal units. The dielectric material can be applied by any one of a variety of known processes in which the substrate is heated in a low pressure ambient. For display applications, the material is preferably silicon nitride and it is preferably applied by plasma enhanced chemical vapor deposition (PECVD). Typical thicknesses are in the range 2000–5000 nm.

The fifth step is to pattern the applied layer of dielectric material. This typically involves masking the dielectric layer with photoresist and etching away the unmasked portion. For silicon nitride hydrofluoric acid (BHF) is the preferred etchant. It is in this step that the advantages of the FIG. 1 process become apparent. With conventional metal patterning, the etching rate varies widely from regions of the substrate surface where glass is exposed to regions in the interior area of large solid area metal units, making design and control of the etching process difficult. In contrast, with the patterning of FIGS. 3 and 4, the etching rate is substantially uniform across the surface, simplifying design and control. In the specific embodiment of FIG. 2, the nitride over bonding pad contacts 23 is removed while the nitride over the frame 24 is left.

The problem of nonuniform etching and the degree of enhanced uniformity can be better understood by consideration of the following specific examples.

EXAMPLE 1

Solid Large Area Metal Units

Cr metal (100 nm) was sputter deposited on Corning 7059 glass substrates, 320×400×1.1 mm, using a Leybold ZV6000 in-line tool. Using a TEL America cluster tool, 300 nm of a—SiN:H was deposited by running a 700 W plasma through 0.75 torr of $SiH_4$ (200 sccm), $NH_3$ (2400 sccm), and $N_2$(2400 sccm). The temperature of the electrode on which substrates are clamped was maintained at 330° C.

Figure 5:
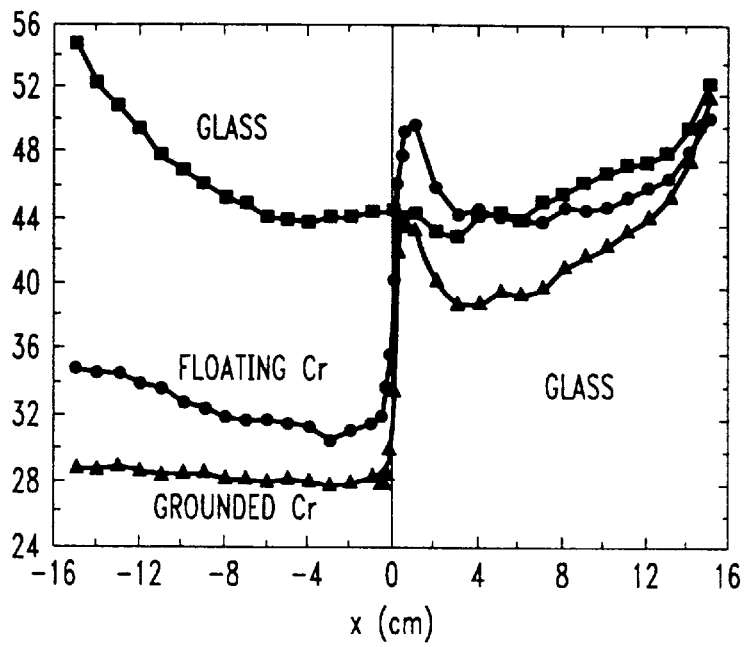
FIG. 5 is a graphical illustration showing the variation in etching rate of a thin film of silicon nitride on a substrate having an unpatterned large area structure.

After deposition, photoresist was applied and a grid of lines and spaces were patterned in the nitride to permit etch depth measurement using a stylus profilometer (Dektak FPD 450). Etching was performed by dipping the plates into a tub of BHF for 5 minutes. The etching was independent of agitation indicating that the etching was surface-rate limited and not transport limited. FIG. 5 shows etch rates measured as a function of position along the horizontal (x-axis) center of the glass. Specifically, FIG. 5 shows BHF etch rates for PECVD a—SiN:H for underlying substrates of unpatterned glass, half grounded-Cr and half glass, and half floating-Cr and half glass, respectively. For the unpatterned glass surface, a systematic increase in the BHF etch rate toward the edges of the glass are evident. This large-scale nonuniformity is attributed to plasma non-uniformity created by the use of grounded, un-heated, clamps on the glass edges.

EXAMPLE 2

Patterned Large Area Metal Units

Figure 6:
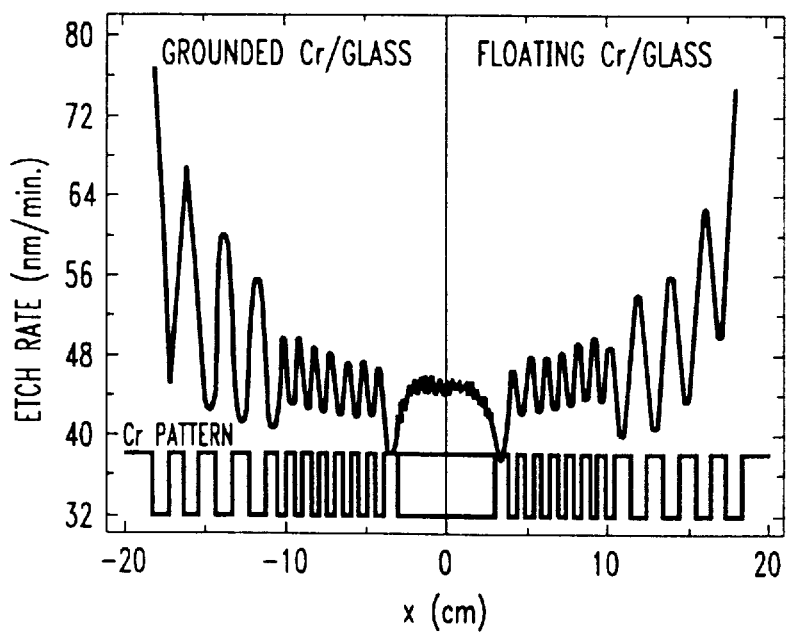
FIG. 6 is a graphical representation showing the improvement of etching rate uniformity of silicon nitride with decreasing metal line width.

In a set of similarly made substrates, the large area Cr regions were patterned with line/space dimensions ranging from 2 to 10 mm, and the nitride etching rates were measured. FIG. 6 is a graphical plot of the etch rate as a function of position (and hence line/space dimension). As can be seen, the BHF etch rate is consistently higher for films deposited on glass and for Cr adjacent to glass. As the line/space dimension shrinks to 2 mm, the BHF etch rate becomes independent of the underlying pattern.

While not necessary for the invention, applicants believe that the inhomogeneities across the nitride film on the unpatterned large area Cr units are due to temperature differences between the Cr and the glass. These temperature differences, in turn, lead to inhomogenieties in the nitride films. Because these thermal effects are driven by differences in thermal emissivity, similar effects will occur when dielectrics other than silicon nitride and metals other than Cr are used.

Such dependence of deposited film properties on underlying patterns causes problems during etching of the a—SiN:H films for flat panel displays because over-etching is required to clear contact windows on large area metal pads. When the distance between adjacent metal lines in less than 1–2 mm, little difference in temperature will occur, and homogeneous nitride coatings can be applied.

While the preferred embodiment of the invention is the application of silicon nitride films, the method of the invention applies equally to the application of layers of other dielectric materials such as $SiO_x$ and a—Si. The method is advantageous in deposition systems which operate under a radiative heat loss mechanism, that is in systems where a heterogeneous substrate is heated in a low pressure chamber to a temperature greater than the surrounding chamber and the pressure in the chamber is less than a few Torr (less than about 5 torr). In this context it can be understood that a heterogeneous substrate can be any homogeneous substrate including thereon a patterned layer of material, the pattern having large areas greater than about 2 $mm^2$ and the material having a thermal emissivity different from the material of the underlying homogeneous substrate.

The Invention claimed is:

1. A method for coating a homogeneous layer of dielectric material overlying a metal coating on a substrate comprising the steps of:

applying a coating of metal to a substrate surface;

patterning said metal coating to form one or more metal structures having an area of at least 81 $mm^2$, said patterning configured so that more than 90% of said metal is within 1 mm of a metal edge; and applying a coating of dielectric material over said patterned metal, the coating of dielectric material having a thickness in the range 2000–5000 nm and a uniform etching rate.

2. The method of claim 1 wherein said dielectric layer is applied in a low pressure chamber having a pressure less than about 5 Torr and said substrate is heated to a temperature higher than said chamber.

3. The method of claim 1 wherein said patterning is configured in a series of intersecting metal stripes.

4. The method of claim 3 wherein said metal is chromium.

5. The method of claim 1 wherein said substrate is glass, said dielectric material is silicon nitride and said silicon nitride is applied by PECVD.

6. The method of claim 1 wherein said coating of dielectric material is applied by plasma enhanced chemical vapor deposition (PECVD).

7. The method of claim 1 wherein said substrate comprises an insulating material.

8. The method of claim 1 wherein said metal is applied by sputtering.

9. The method of claim 1 wherein said patterning step forms a grid of interconnected, intersecting strips.

10. The method of claim 1 wherein said patterning step forms a grid of interconnected, intersecting strips comprising a grid at least 9 mm×9 mm.

\* \* \* \* \*